United States Patent [19]

Shou et al.

[11] Patent Number: 5,440,605
[45] Date of Patent: Aug. 8, 1995

[54] MULTIPLICATION CIRCUIT

[75] Inventors: Guoliang Shou; Weikang Yang; Sunao Takatori; Makoto Yamamoto, all of Tokyo, Japan

[73] Assignee: Yozan Inc., Tokyo, Japan

[21] Appl. No.: 242,837

[22] Filed: May 16, 1994

[30] Foreign Application Priority Data

May 17, 1993 [JP] Japan .................................. 5-139136

[51] Int. Cl.[6] .......................... G11C 27/02; G06F 7/44
[52] U.S. Cl. ........................................ 377/47; 327/94; 327/356; 327/407
[58] Field of Search ........................... 307/353; 377/47; 327/94, 356, 407

[56] References Cited

U.S. PATENT DOCUMENTS 5,311,087  5/1994  Suganuma ........................... 307/353

OTHER PUBLICATIONS

Massara, Robert E., "Synthesis of Low-Pass Forms", The Electrical Engineering Handbook, 1993, pp. 674–691.

Primary Examiner—Margaret Rose Wambach
Attorney, Agent, or Firm—Cushman, Darby & Cushman

[57] ABSTRACT

A multiplication circuit of minimized transfer error having a selector for inputting analog data to one of a plurality of sample hold circuits. The data input in the sample hold circuit is introduced to one of a plurality of multiplication circuits by a multiplexer with multi-input and -output. Data is not transferred between adjacent sample hold circuits.

3 Claims, 2 Drawing Sheets

MULTIPLICATION CIRCUIT

FIELD OF THE INVENTION

The present invention relates to a multiplication circuit for directly multiplying analog data and digital data.

BACKGROUND OF THE INVENTION

In recent years, a disparity has arisen with regard to increases in investment in digital equipment and increases in performance resulting from that investment. For that reason, analog computers are drawing more attention. On the other hand, it would be advantageous to develop a circuit with coexistence and cooperation of analog and digital circuits because there are many applications accumulated in the digital electronics field which it would support.

The inventors of the present invention have filed a patent application concerning a multiplication circuit for directly multiplying analog data and digital data. In such a multiplication circuit, it is usually difficult to sample and hold analog or multi-valued data without causing an error during transfer of data. Therefore, the above multiplication circuit has a problem concerning transfer errors.

SUMMARY OF THE INVENTION

It is an object of the present invention to solve the above problems and to provide a multiplication circuit of minimized transfer error.

A multiplication circuit according to the present invention has a selector for inputting analog data to one of a plurality of sample hold circuits. The data once held in the sample hold circuit is introduced to one of a plurality of multiplication circuits by a multiplexer with multi-input and -output. Accordingly, data is not transferred between adjacent sample hold circuits.

PREFERRED EMBODIMENT OF THE PRESENT INVENTION

Hereinafter an embodiment according to the present invention is described with reference to the attached drawings.

Figure 1:
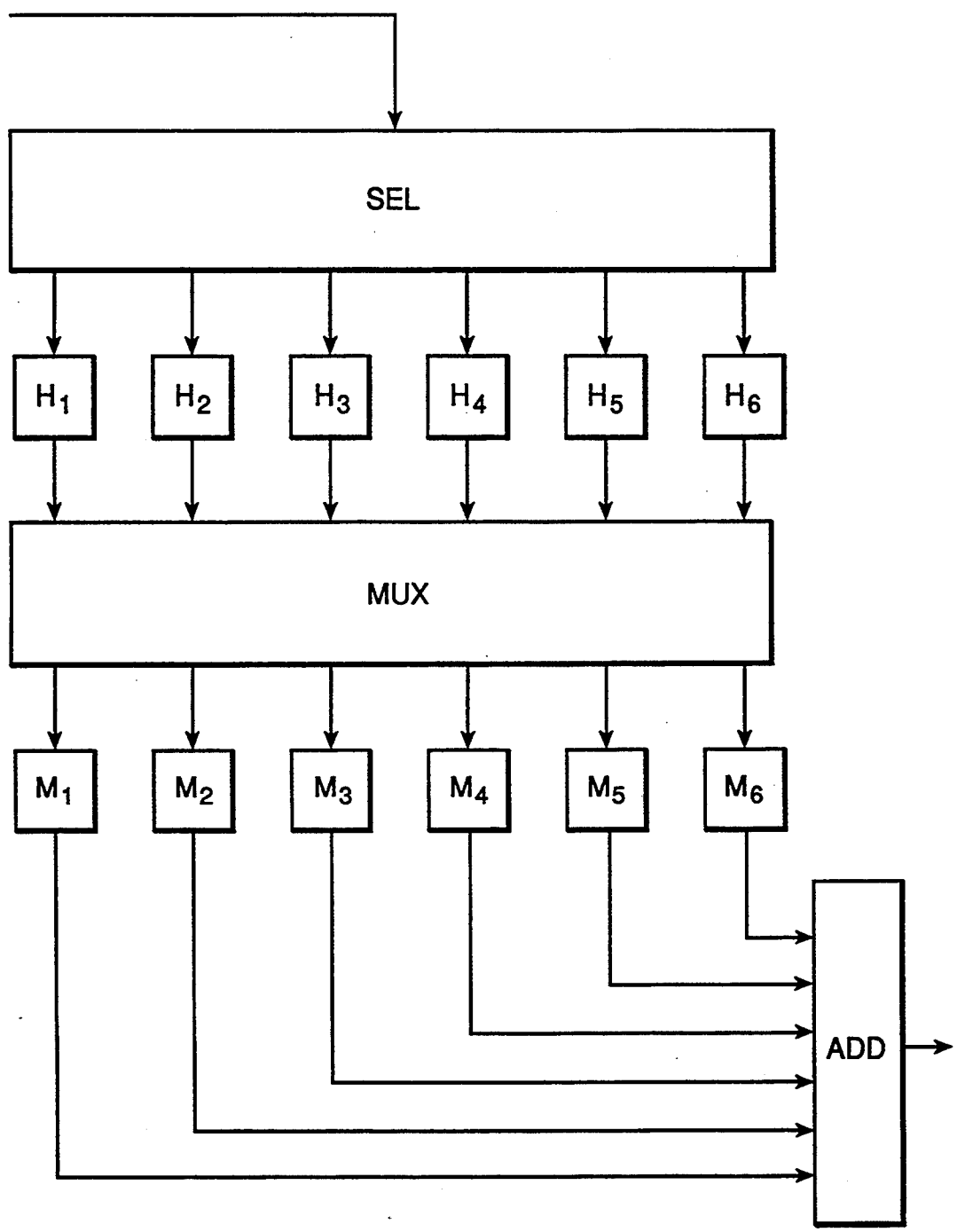
FIG. 1 is an example of a block diagram of a multiplier circuit relating to the present invention.

In FIG. 1, a multiplication circuit consists of an input multi-output selector SEL, a plurality of sample hold circuits H1 to H6 connected with the selector SEL, multi-input multi-output multi-plexer MUX connected with sample hold circuits H1 to H6, a plurality of multipliers M1 to M6 connected with the multi-plexer MUX, and adder ADD connected with these multipliers M1 to M6.

If an analog input voltage X is input to an input multi-output selector SEL, selector SEL outputs the analog input voltage, X as an analog data to one of a plurality of sample hold circuits H1 to H6, for example H1. The next analog data is then output to the other sample hold circuits H2 to H6.

The analog data X can be introduced to any one of sample hold circuits from H1 to H6 by means of the selector SEL. The held data in a sample hold circuit is then transferred to any one of multiplication circuits by means of the multiplexer MUX having multi-inputs and multi-outputs.

At the output side, each of sample hold circuits H1 to H6 is connected with multi-input, multi-output multiplexer MUX so as to output the analog data to multiplexer MUX. At the output side, the multiplexer MUX is connected with a plurality of multipliers M1 to M6.

Data X can be introduced to any one of the sample hold circuits using the selector, and the data in the sample hold circuit can be introduced to any one of the multipliers using the multiplexer. The patent application for a multiplication circuit previously filed by the present inventor includes a plurality of sample hold circuits which successively transfer an analog data one after another, resulting in an increased error. Alternatively, the circuit of the present invention is free from the transfer error between the sample hold circuits.

Figure 2:
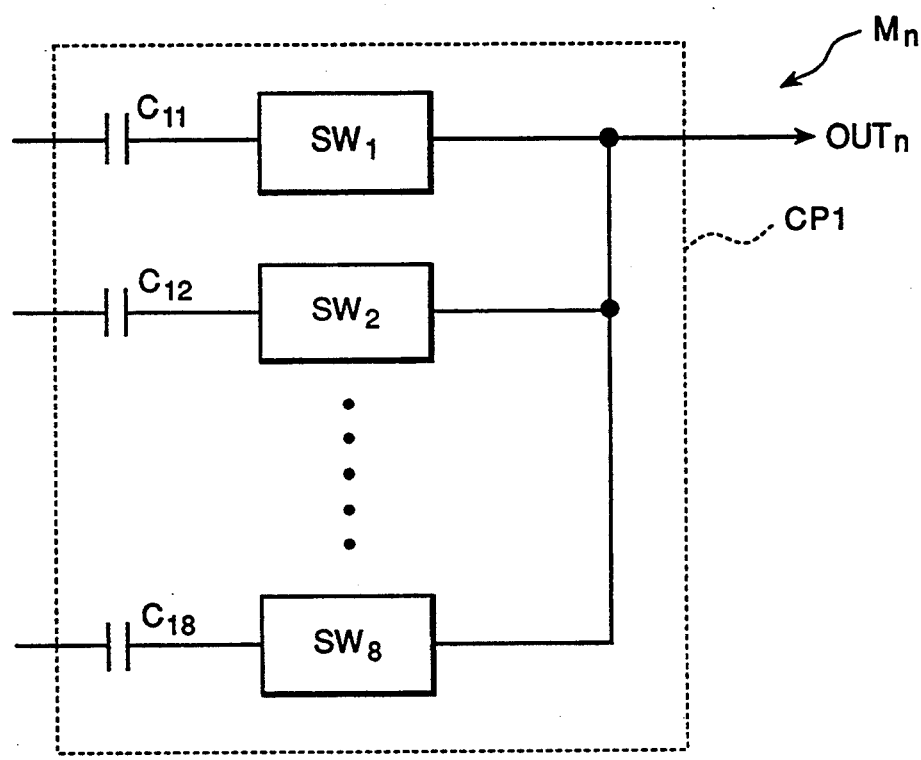
FIG. 2 is an example of a circuit diagram of multiplier Mn.

FIG. 2 shows a circuit example of multiplier Mn connected with multiplexer MUX. In multiplier Mn, a serial combination of capacitances C11 to C18 corresponding switching means SW1 to SW3 in parallel, capacitances C11 to C18 having a capacity corresponding to each figure of a binary system Multiplier Mn consists of capacitive coupling CP1 which switchably unifies an output of each capacitance C11 to C18. Here, outputs of capacitances C11 to C18 are controlled by their corresponding switching means SW1 to SW8, and multiplier value OUTn of multiplier Mn can be easily changed.

Each multiplier M1 to M6 outputs multiplier value OUT1 to OUT6 corresponding to switching conditions of each switching means SW1 to SW8 to adder ADD.

Figure 3:
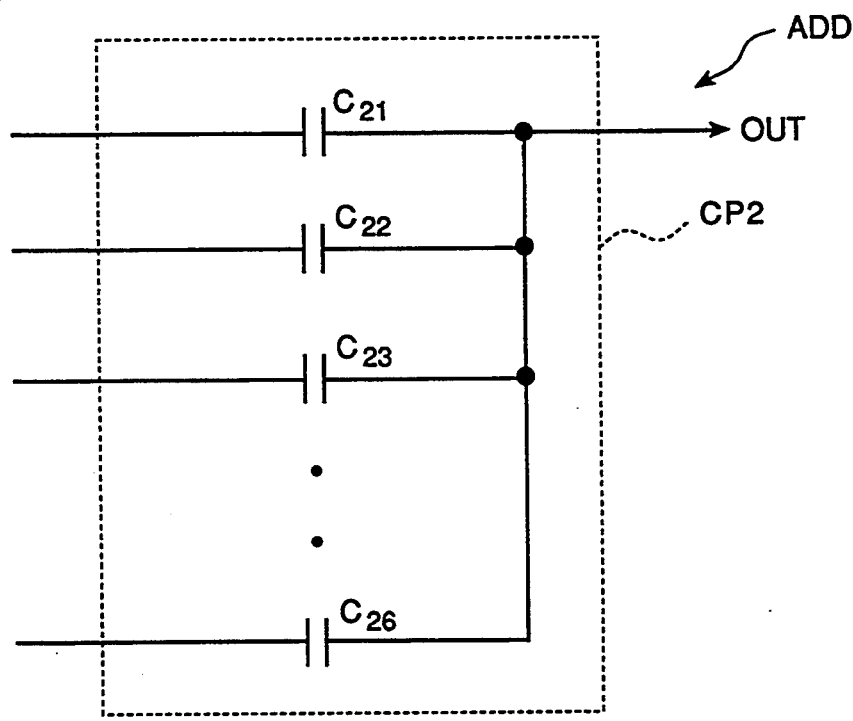
FIG. 3 is an example of a circuit diagram of adder ADD.

A circuit embodiment of adder ADD is shown in FIG. 3. Adder ADD consists of capacitive coupling CP2 parallelly connecting capacitances C21 to C26 with same capacity.

At each capacitance C21 to C26, multiplier values OUT1 to OUT6 generated by each multiplier M1 to M6 are input. A multiplication result, OUT, of a multiplication circuit relating to the present invention is generated as output.

As mentioned above, a multiplication circuit according to the present invention connects a plurality of sample hold circuits with an output side of an input multi-output selector, connects multi-input multi-output multiplexer to these plurality of sample hold circuits, has a plurality of multipliers corresponding to multi-output of the multiplexer, and optically connects summing multiplier to the plurality of multipliers, so that it has an effect that controls a transfer error in the minimum.

What is claimed is:

1. A multiplication circuit comprising:
    a selector having one input and a plurality of outputs;
    a plurality of sample hold circuits corresponding to said outputs of said selector, each having one input and one output, said input of each said sample hold circuit being connected to one of said outputs of said selector;
    a multiplexer having a plurality of inputs and outputs corresponding to said outputs of said selector, each said input being connected with one output of said sample hold circuit;
    a plurality of multiplication circuits corresponding to said outputs of said selector, each said multiplication circuit having one input and output, each said input being connected to one of said output of said multiplexer, each said multiplication circuit comprising a plurality of capacitances having opposite terminals, a first terminal of each capacitance being connected commonly with said outputs of said multiplexer and a second terminal of each capacitance being connected with said output of said multiplication circuit, said capacitances having capacitance values corresponding to digits of a binary number.

2. A multiplication circuit as claimed in claim 1, wherein said input of said selector is connected with analog voltage input.

3. A multiplication circuit comprising:

a selector having one input and a plurality of outputs;

a plurality of sample hold circuits arranged in parallel, each receiving input from one of said selector outputs;

a multiplexer for receiving inputs from said plurality of sample hold circuits and for generating a plurality of outputs; and a plurality of multiplication circuits arranged in parallel, one of said multiplication circuits receiving each of said outputs generated by said multiplexer, respectively, each of said multiplication circuits having a multiplication value corresponding to one digit of a binary number.

* * * * *